US009466961B2

(12) United States Patent
Thoerner et al.

(10) Patent No.: US 9,466,961 B2
(45) Date of Patent: Oct. 11, 2016

(54) GENERATOR CONNECTION BOX FOR PHOTOVOLTAIC INSTALLATIONS
(71) Applicant: Phoenix Contact GmbH & Co. KG, Blomberg (DE)
(72) Inventors: Carsten Thoerner, Melle (DE); Andreas Senger, Altenbeken (DE)
(73) Assignee: Phoenix Contact GmbH & Co. KG, Blomberg (DE)
( * ) Notice: Subject to any disclaimer, the term of this patent is extended or adjusted under 35 U.S.C. 154(b) by 58 days.
(21) Appl. No.: 14/359,680
(22) PCT Filed: Nov. 23, 2012
(86) PCT No.: PCT/EP2012/073538
§ 371 (c)(1),
(2) Date: Aug. 21, 2014
(87) PCT Pub. No.: WO2013/076285
PCT Pub. Date: May 30, 2013
(65) Prior Publication Data
US 2014/0352998 A1 Dec. 4, 2014
(30) Foreign Application Priority Data

Nov. 23, 2011 (DE) .................. 10 2011 119 173

(51) Int. Cl.
*H02G 3/08* (2006.01)
*H01L 31/042* (2014.01)
(Continued)
(52) U.S. Cl.
CPC ........ *H02G 3/083* (2013.01); *H01L 31/02008* (2013.01); *H02S 40/00* (2013.01); *H02B 1/46* (2013.01); *Y02E 10/50* (2013.01)
(58) Field of Classification Search
CPC .......... H02G 3/083; H02G 3/08; H02G 3/16; H02G 3/081; H01L 31/02008; H02S 40/00; H02S 40/34; H02B 1/46; H02B 1/48; H02B 1/32; Y02E 10/50; H01R 9/24; H01R 9/2408; H02J 3/383

USPC ....... 174/50–50.54, 520, 535–537, 549, 551, 174/559, 541; 361/600, 601, 641; 136/244; 439/527, 535
See application file for complete search history.

(56) References Cited

U.S. PATENT DOCUMENTS 4,654,470 A * 3/1987 Feldman .............. H01R 4/2483
174/50
6,456,203 B1 * 9/2002 Schomaker .............. H02B 1/34
174/651

(Continued)

FOREIGN PATENT DOCUMENTS

CN         1950707 A      4/2007
DE      202008007846    10/2008

(Continued)

OTHER PUBLICATIONS

Mersen: "Combiner Boxes for Solar Arrays", Dated: Mar. 9, 2011, XP055053328, URL:http://ep-ca.mersen.com/pdf/Solar-Array-Combiner-Boxes.pdf.

(Continued)

*Primary Examiner* — Dimary Lopez Cruz
(74) *Attorney, Agent, or Firm* — Reising Ethington PC

(57) ABSTRACT

A generator junction box for a photovoltaic generator is presented, which has a junction box housing with a back wall and a surrounding side wall, and input modules, each with an integrated quick connector for connecting a generator string line to the associated input module, wherein the input modules are situated directly against the surrounding side wall of the junction box housing in such a way that it is possible to connect the string lines directly to the quick connector of the associated input module from the outside.

14 Claims, 9 Drawing Sheets

(51) Int. Cl.
*H01L 31/02* (2006.01)
*H02B 1/46* (2006.01)

(56) References Cited

U.S. PATENT DOCUMENTS

| | | | | |
|---|---|---|---|---|
| 7,672,116 | B2* | 3/2010 | Li | H02G 3/08 |
| | | | | 361/641 |
| 8,854,825 | B2* | 10/2014 | Yamazaki | H02S 40/34 |
| | | | | 361/730 |
| 2010/0012343 | A1 | 1/2010 | Ji et al. | |
| 2010/0039781 | A1 | 2/2010 | Tai et al. | |
| 2011/0031814 | A1 | 2/2011 | Giesler | |
| 2011/0318975 | A1 | 12/2011 | Giefers et al. | |
| 2012/0000689 | A1* | 1/2012 | Shu | H02S 40/34 |
| | | | | 174/59 |
| 2012/0033392 | A1* | 2/2012 | Golubovic | H02S 40/34 |
| | | | | 361/752 |
| 2012/0056708 | A1* | 3/2012 | Ventura | H01H 85/545 |
| | | | | 337/207 |
| 2012/0077392 | A1* | 3/2012 | Thompson | H01R 13/11 |
| | | | | 439/889 |

FOREIGN PATENT DOCUMENTS

| | | |
|---|---|---|
| DE | 102008061268 | 6/2010 |
| DE | 102009036281 | 2/2011 |
| DE | 202011000284 | 6/2011 |
| DE | 202010006110 | 10/2011 |
| EP | 2146383 | 1/2010 |
| WO | 2005106505 A1 | 11/2005 |
| WO | 2009101096 | 8/2009 |

OTHER PUBLICATIONS

PCT International Search Report, PCT Int. Serial No. PCT/EP2012/073538, Int Filing Date: Nov. 23, 2012, Applicant: Phoenix Contact GmbH & Co. KG, Date Mailed: Feb. 27, 2013.
German Office Action, DE Serial No. 10 2011 119 173.2, Applicant: Phoenix Contact GmbH & Co. KG, Date: Aug. 31, 2012.
German Office Action, DE Serial No. 10 2011 119 173.2, Applicant: Phoenix Contact GmbH & Co. KG, Date: Jun. 25, 2013.
Translation of PCT Int. Preliminary Report on Patentability, Serial No. PCT/EP2012/073538, Filing Date: Nov. 23, 2012, Applicant: Phoenix Contact GmbH & Co. KG, Date Mailed: Jun. 5, 2014.
Chinese Office Action, Application No. 201280057685.2, Applicant: Phoenix Contact GmbH & Co. KG, Title: Generator Connection Box for Photovoltaic Installations, Mail Date: Jan. 6, 2016.
Chinese Office Action, Applicant/Patent No. 201280057685.2, Applicant: Phoenix Contact GmbH & Co. KG, Title: Generator Connection Box for Photovoltaic Installations, Date of Notification: Jul. 4, 2016.

* cited by examiner

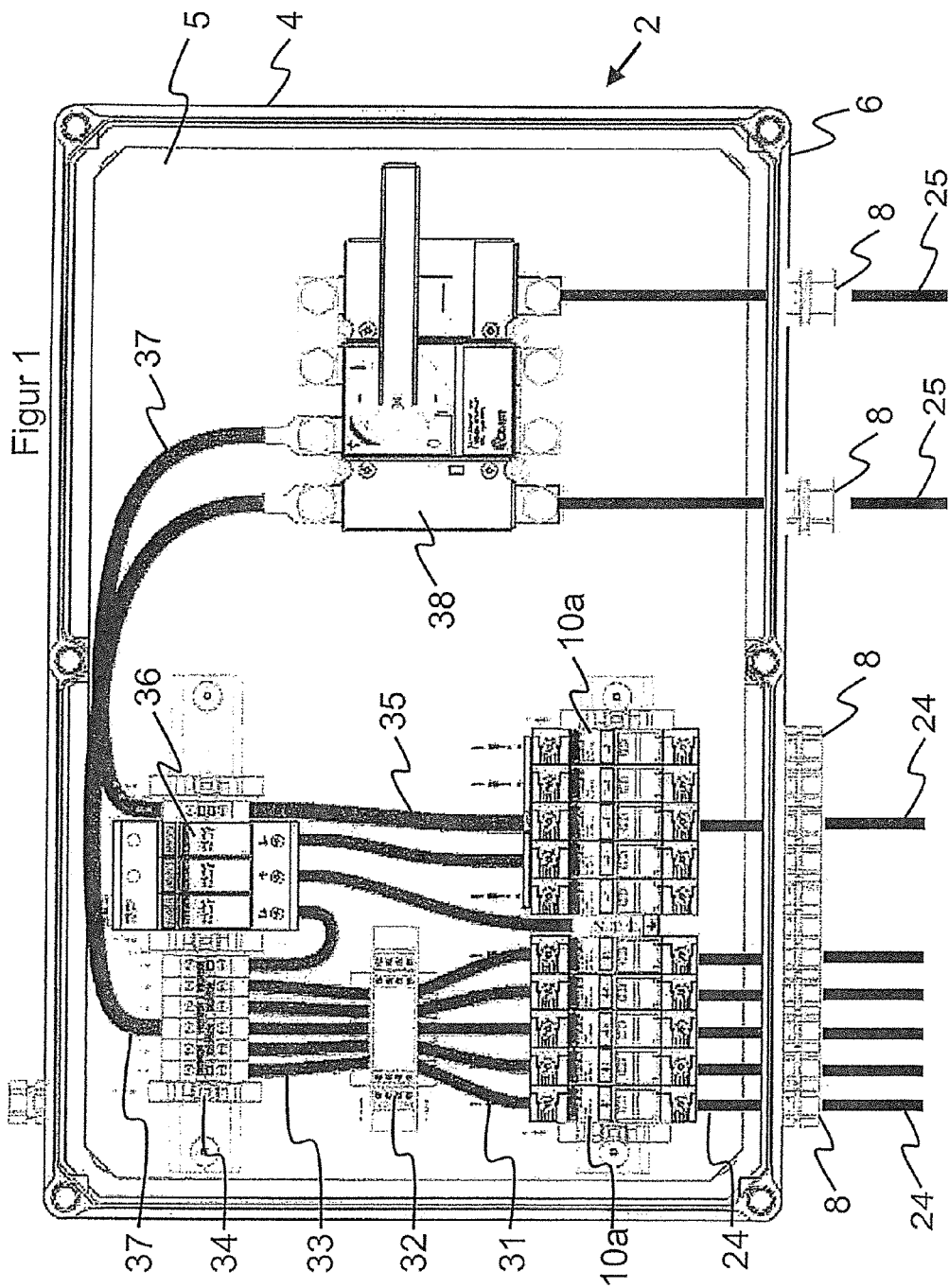
Figur 1

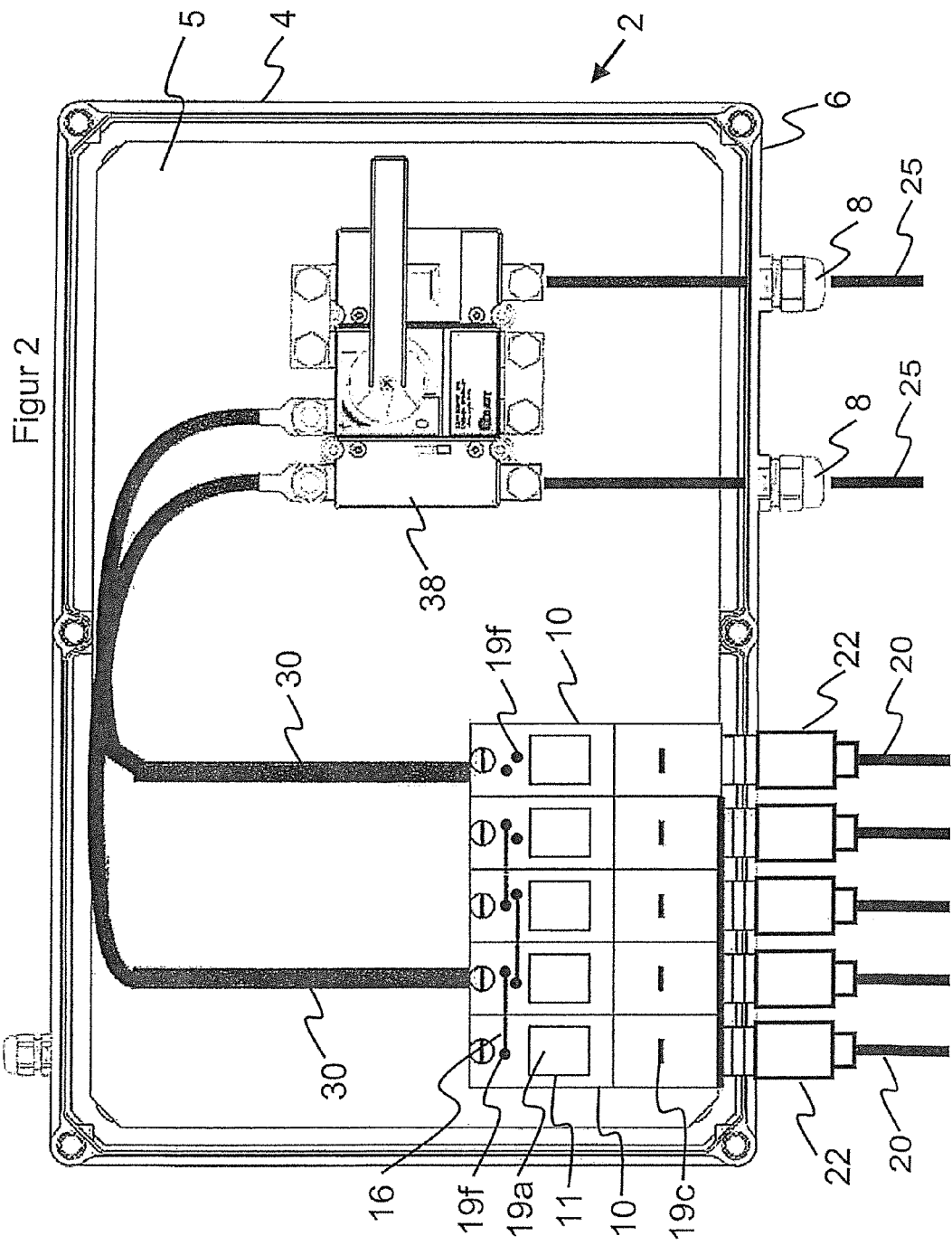

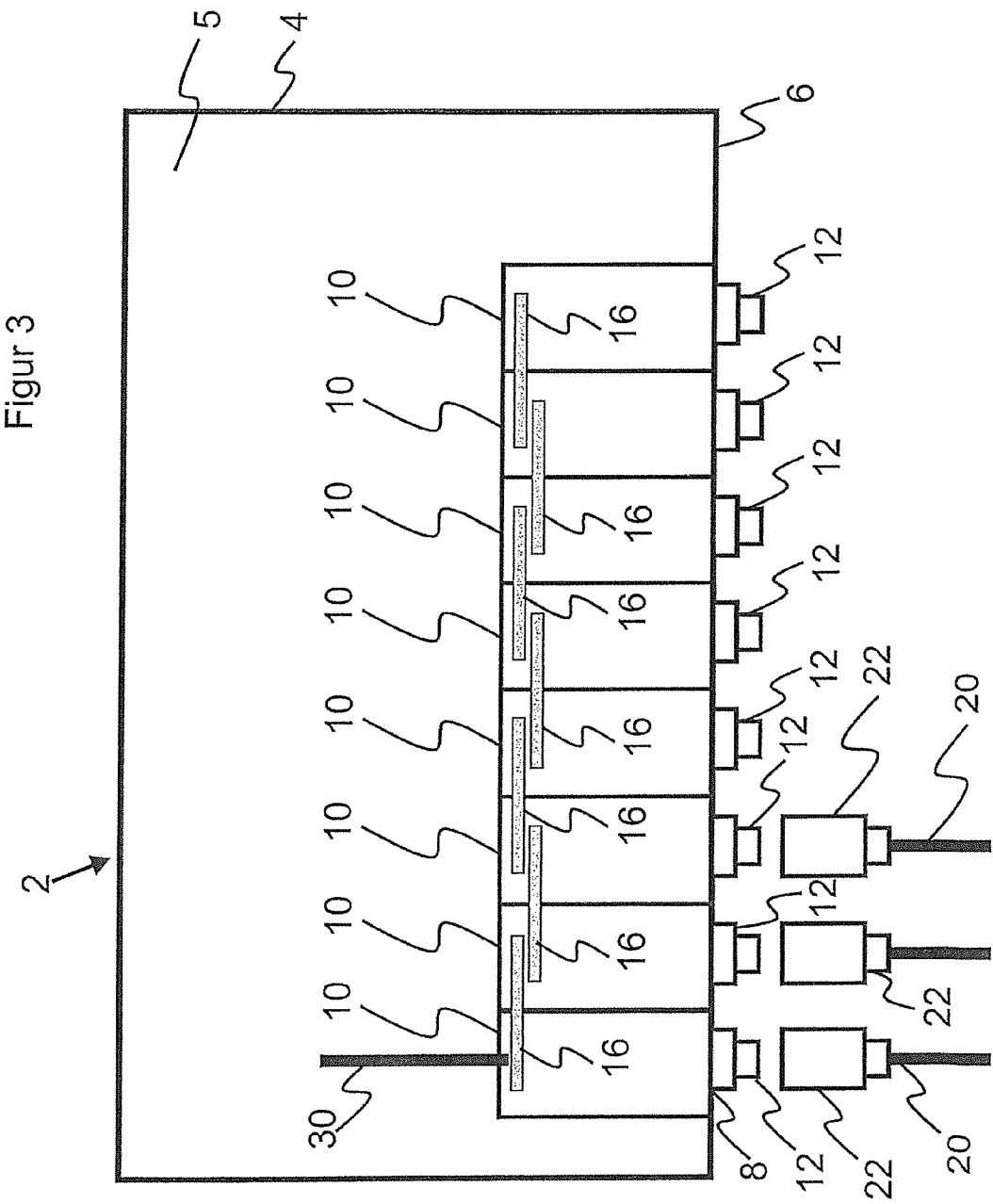

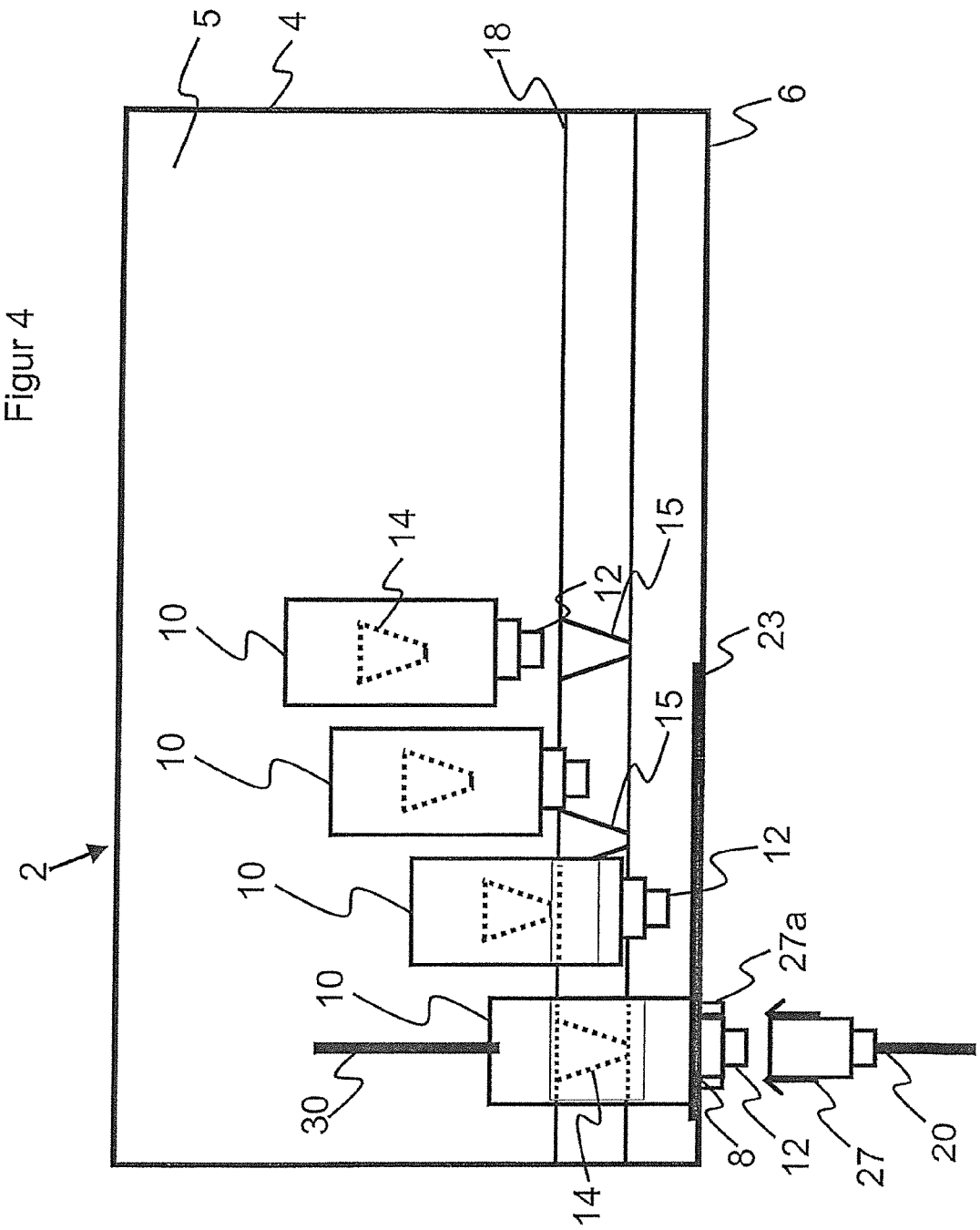

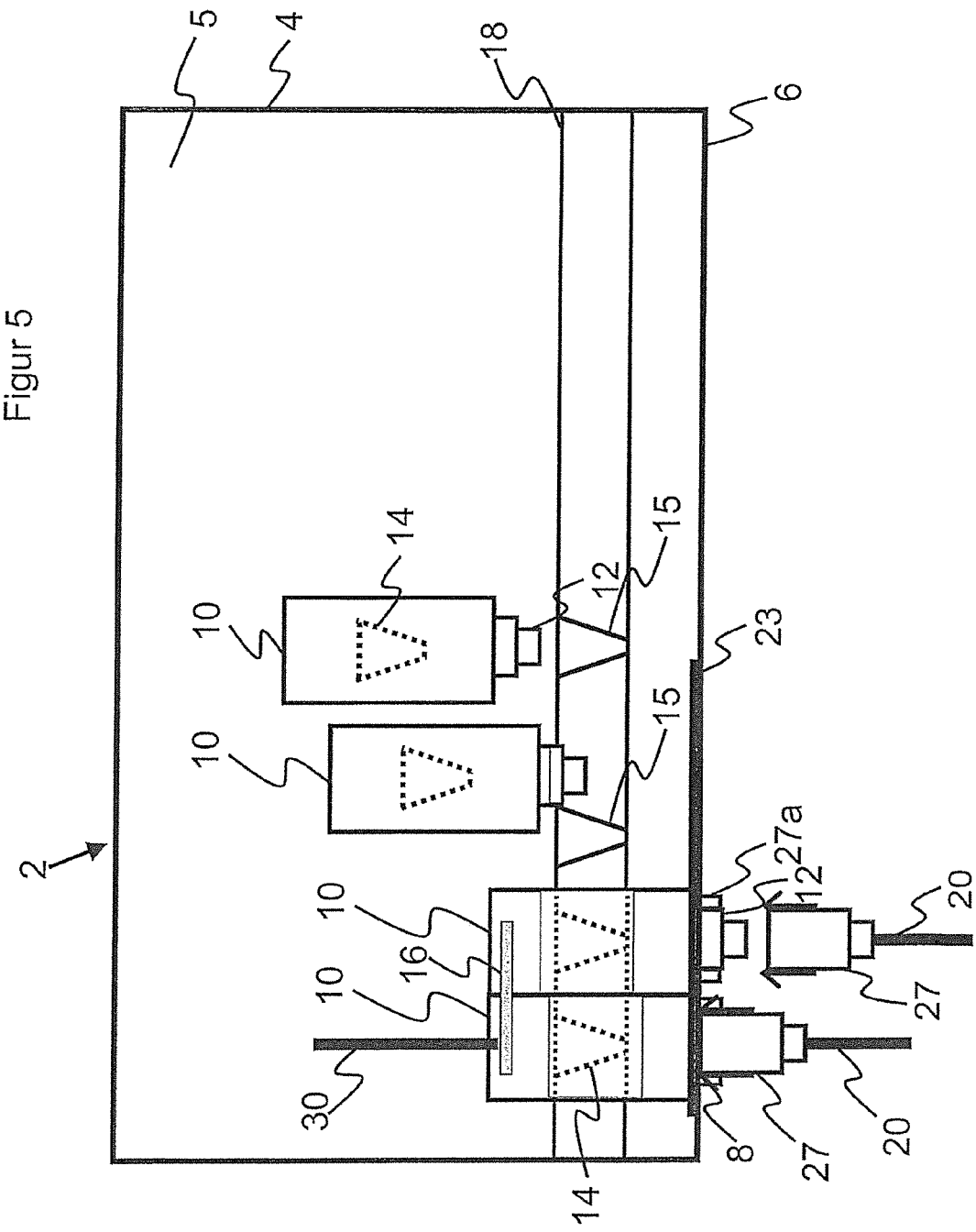

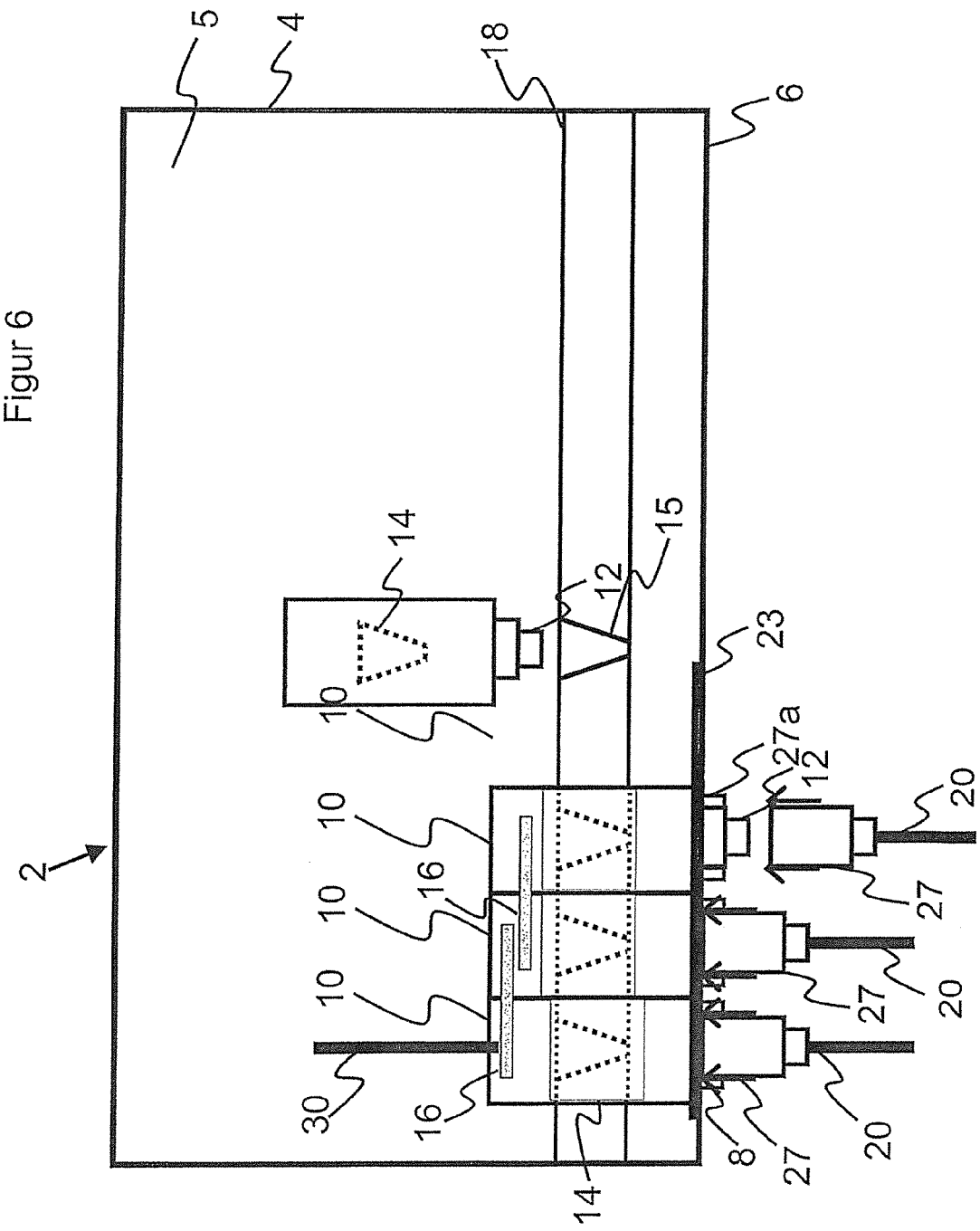

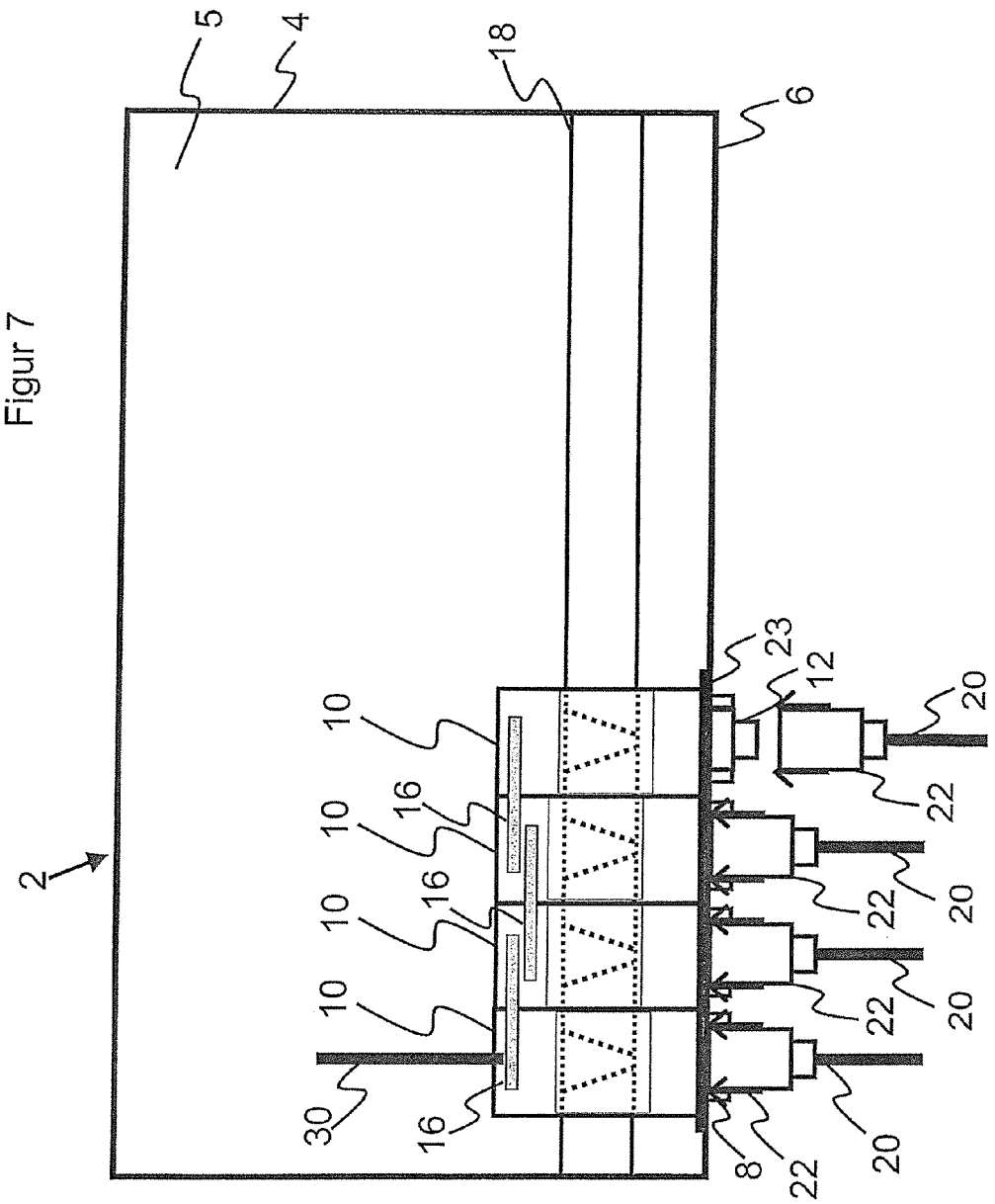

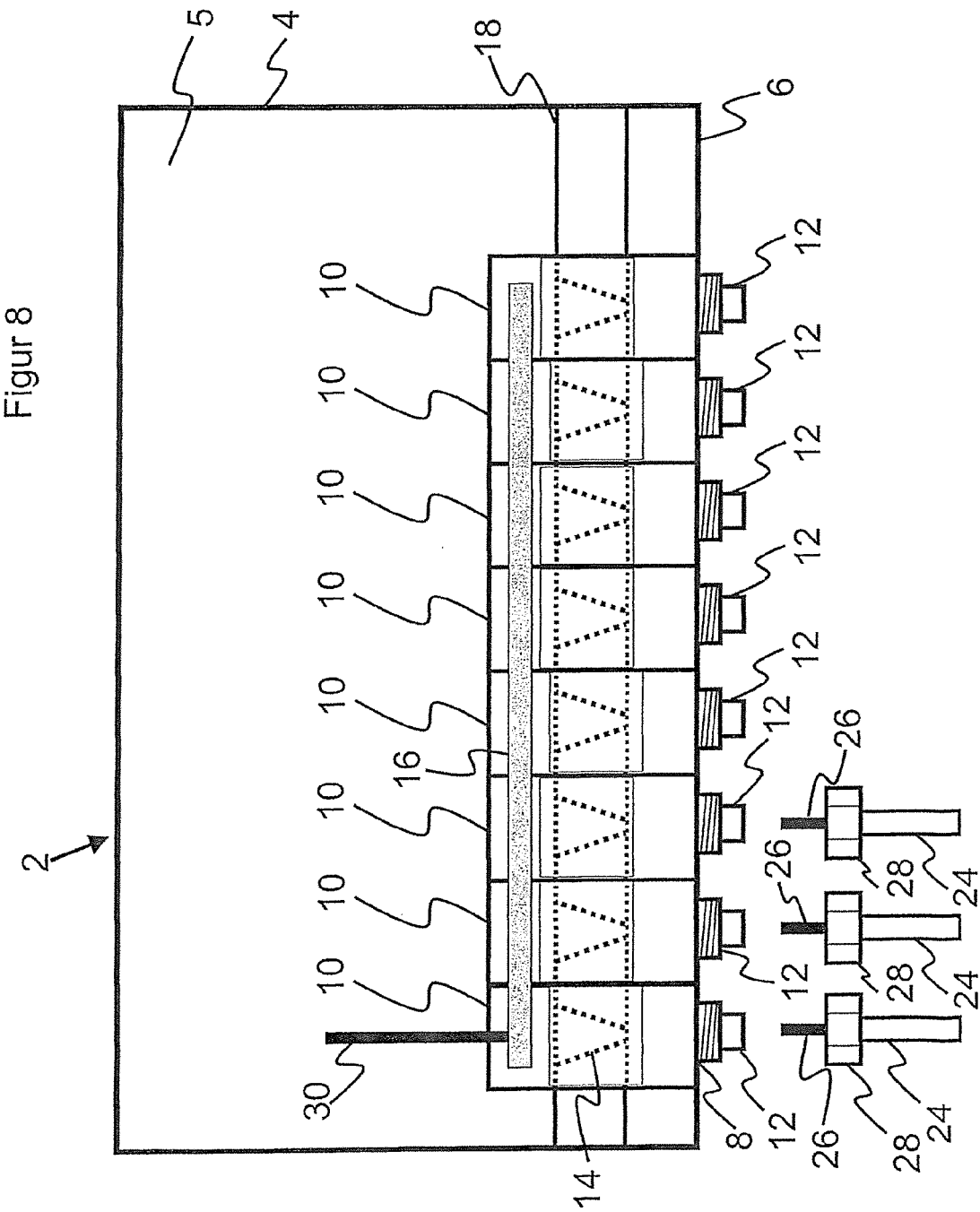

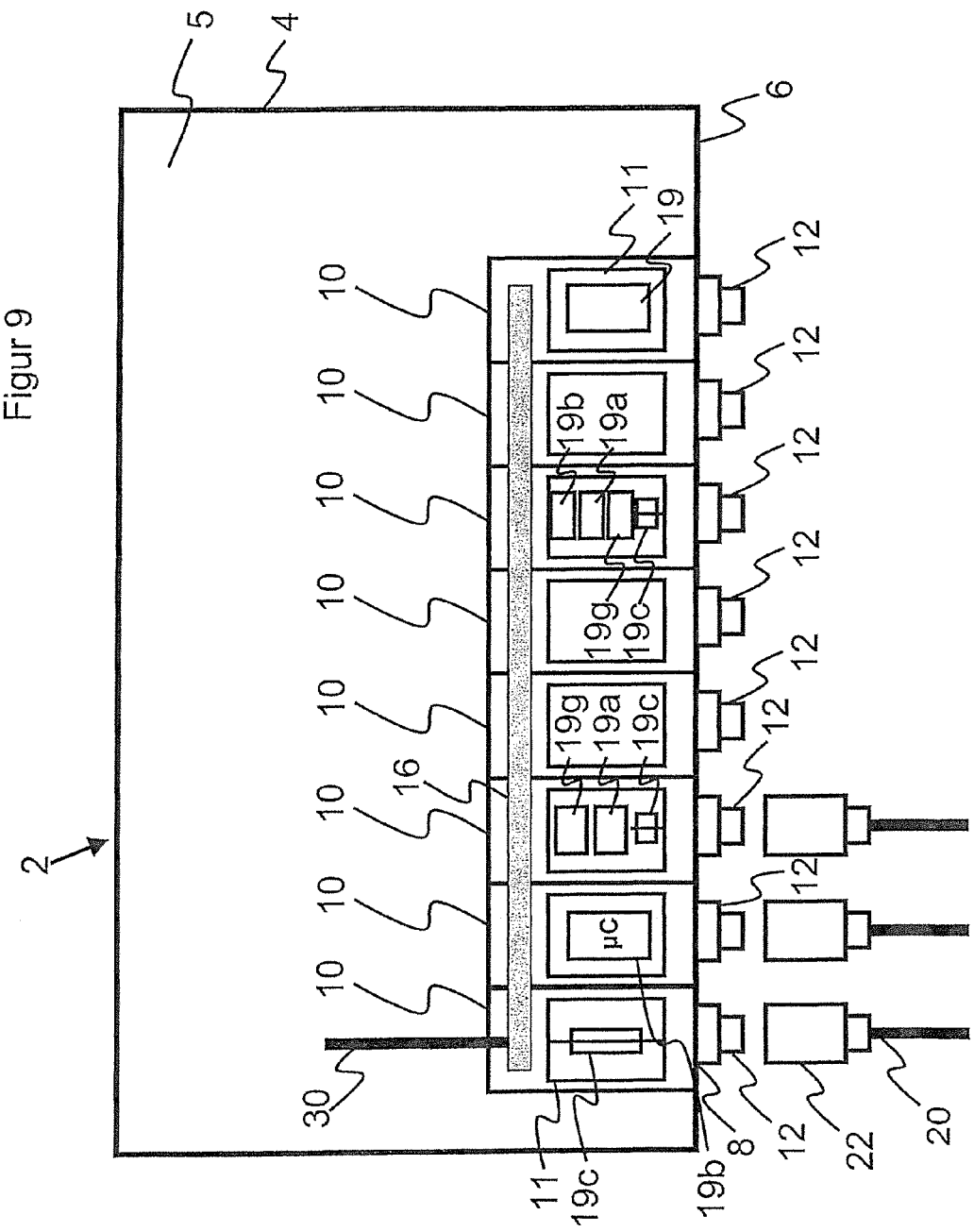

GENERATOR CONNECTION BOX FOR PHOTOVOLTAIC INSTALLATIONS

TECHNICAL FIELD

The present disclosure relates to a generator junction box for a photovoltaic generator as well as input modules for installation in a generator junction box.

BACKGROUND

In a photovoltaic generator for producing electrical power from sunlight, the whole generator is typically subdivided into individual strings composed of a plurality of series-connected photovoltaic solar modules. The individual strings of the photovoltaic generator are in turn connected in parallel to one another.

Typically, an electrical connecting line is laid from each of the strings, which are connected in parallel to one another, to a generator junction box. The lines of all of the strings are thus bundled in this generator junction box.

The individual photovoltaic generator string connecting lines, string lines for short, are usually routed individually through the housing wall into the generator junction box and are connected to components contained inside the generator junction box. The electrical connection to the components is typically produced by means of a clamped or screwed connection. When there are numerous string lines, this is complex and requires a significant amount of installation work in order to connect them to the components of the generator junction box. Furthermore, a strain relief of the string line may also be difficult to implement.

After the component that is connected to the string line, other components may have to be installed in the generator junction box, e.g., measuring components for a string current measurement that is to take place therein, connecting components for a bridge connection of a plurality of string lines, or also a circuit breaker for disconnecting the whole generator from the downstream components such as the inverters for feeding into the grid. These components also require labor-intensive individual wiring by the installer.

FIG. 1 shows the internal layout of a known generator junction box. The string lines 24 of the photovoltaic generator are connected to terminals of input modules 10a. For this purpose, the string lines are routed through openings 8 in the surrounding side wall 6 of the junction box housing 4 and are connected inside the junction box housing 4 to the terminals of the input modules 10a. Each string line therefore requires a separate input module 10a merely for the purpose of connecting the string line.

From the input modules 10a at which the string lines 24 of the same pole of the photovoltaic generator are connected, a respective electrical measuring module line 31 is laid to a measuring module 32 that is typically used to perform an individual string current measurement. From the measuring module 32 in turn, for each string of the PV generator to be connected, a respective electrical jumper module line 33 is laid to a respective jumper module 34. A jumper module 34 is used to bridge the individual PV strings and thus to combine the string currents produced.

If need be, additional electrical connecting lines are provided in the generator junction box, for example for connecting a main circuit breaker 38 by means of a circuit breaker line 37 or for connecting other modules 36.

The labor-intensive connection of the string lines to the input modules and the installation and the electrical connection of the large number of different modules 10a, 32, 34, 36 required in the generator junction box result in unnecessary time and cost factors that the prior art is unable to satisfactorily reduce.

GENERAL DESCRIPTION

The object of the present disclosure, therefore, is to solve or reduce the abovementioned problems.

Especially, one object of the present disclosure is to create a generator junction box that permits a quick and reliable connection of string lines to the modules contained in the generator junction box and minimizes the installation work for the installer.

Another object of the present disclosure is to create a generator junction box in which the amount of wiring work inside the generator junction box is reduced.

Yet another object of the present disclosure is to create input modules, which can be easily connected to one another inside the generator junction box, to which string lines can be quickly and reliably connected, and the use of which reduces the amount of installation work.

The object of the present disclosure is attained by the subject of the independent claims. Advantageous modifications of the present disclosure are defined in the dependent claims.

According to the present disclosure, a generator junction box for a photovoltaic generator has a junction box housing with a back wall, a surrounding side wall, and a front cover. The back wall is optionally provided with fastening holes for fastening the generator junction box at the installation site, for example to a building wall or a supporting frame. The surrounding side wall has openings in order to connect the modules accommodated in the interior of the generator junction box enclosed by the junction box housing to string lines and other electrical external connections.

Input modules are situated directly at the inner side of the surrounding side wall of the junction box housing so that the string lines can be directly connected from the outside to a quick connector of the associated input module without having to open the front cover. This allows for not having to guide the string lines inside the generator junction box. The string lines are connected to the quick connector of the input module directly from the outside of the junction box housing.

Preferably, the quick connector of the input module extends from the inner region of the junction box housing, through the opening in the surrounding side wall, to the outer region. In this embodiment, the respective string line is connected to the quick connector outside the generator junction box, immediately in the region of the surrounding side wall.

In other words, an input module either contacts the side wall or engages in the opening in the side wall. This means that the input module is positioned against the opening or engaging in the opening from the inside so that when the input module is installed in the generator junction box, the quick connector of the input module is already resting against the opening or engaging in the opening.

The quick connector, which is part of the input module, can therefore be accessed from the outside of the generator junction box for a direct connection of the string line, either in that the quick connector protrudes out from the generator junction box or comes to rest in the opening so that the string line is connected directly to the input module.

To permit easy access to the interior of the generator junction box, the front can be provided with a front surface in the form of a door that can be easily opened and provides access to the interior. It is also possible, however, to actually do without a door since the installer does not have to have access to the interior of the generator junction box. Optionally, a door can be provided that can only be opened by specially authorized personnel.

Connecting string lines directly to the quick connectors from the outside minimizes installation times and therefore also minimizes costs. For example, by means of a simple identification of the respective connections, such as by means of a color coding, the string lines can be connected to the input modules of the generator junction box without access to the interior region. This can reduce the risk of an incorrect wiring inside the generator junction box. An access to the inside of the generator junction box is therefore not required for this embodiment of the present disclosure.

The quick connectors even permit the string lines to be connected to the input modules without the use of tools.

The quick connectors may have an electrical insulation and/or connections that are protected from electrical and physical contact. Connections that are sufficiently protected from electrical and physical contact in the disconnected state can be connected or disconnected, even if an electrical voltage is already present in the string lines, which is usually the case since the solar modules begin to produce power immediately upon exposure to sunlight. This means that even when operation is ongoing and/or when photovoltaic solar modules are already connected, it is possible to permit the servicing of one or more photovoltaic strings without having to switch off the rest of the system. In particular, it means that there is less danger of the installer receiving an electrical shock from the electrical connections.

The junction box housing may be waterproofed in accordance with protection class IP54 and is preferably made of dielectric material.

The respective string line to be connected to the junction box is equipped with a quick connector that is complementary to the quick connector of the input module. This permits a particularly quick and simple connection of the string line and input module in the generator junction box, for example when the quick connector of the string line and the quick connector of the input module are both preinstalled.

In order to connect a stripped conductor end of a string line to the input module, the quick connector of the input module can, for example, be equipped with a connector device that can be operated from the outside of the side wall of the junction box housing in the region of the openings, for example a spring-loaded terminal, a tension spring, or a screw terminal in order to contact the stripped conductor end of the string line without having to open the front cover of the junction box housing.

For example, a strain relief of the string line can be integrated into the quick connector so that when the connection is established, a strain relief is automatically also established, such as by means of a detent connection. Alternatively, a fastening of the string line to the outside of the surrounding side wall of the generator junction box can also perform the function of the strain relief, for example with the aid of a coupling nut that is fastened to an external thread provided at the opening in the surrounding side wall.

For example, the input modules for the plus pole and minus pole are identically embodied. An input module situated in the generator junction box is connected either to a line of the plus pole of the photovoltaic generator or to a line of the minus pole of the photovoltaic generator, depending on which pole the input module is associated with. It is thus possible to reduce production and logistics costs.

For example, a plurality of identical input modules are arranged in the generator junction box; several modules are associated with the plus pole of the photovoltaic generator and several modules are associated with the minus pole of the photovoltaic generator. The input modules associated with one pole of the photovoltaic generator can be bridged directly to one another by means of an electrically conductive jumper that is connected to jumper contacts of the input modules so that the individual strings are electrically connected to form a single unit. A possibly required parallel connection of the string lines can therefore already occur in the input modules.

A main circuit breaker for disconnecting the photovoltaic generator from the power grid or from other components such as inverters can be provided in the generator junction box. If the junction box housing has no door, then the main circuit breaker can also be located on the outside, for example on the surrounding side wall of the generator junction box. Consequently, easy access to the main circuit breaker is provided in any case.

The generator junction box preferably includes mounting means in the junction box housing, for example a mounting plate or mounting rails, to which it is possible to fasten e.g. by means of a catch mechanism the input modules and other possibly required modules that are to be provided in the generator junction box. When mounting the input modules on the mounting means, the quick connectors integrated into the input modules are automatically positioned in or directly against the openings of the surrounding side wall.

The mounting rail may be embodied in the form of a top hat rail (so called "DIN rail") onto which the input modules can be detent connected and with the detent connection to the top hat rail, the quick connectors integrated into the input modules automatically come to rest in or directly against openings in the generator junction box.

The input modules and the mounting rails preferably have a linear guide that guides the input modules to the associated opening in the side wall in linear fashion from above. In the process of this, connecting hooks possibly provided on the back of the input modules engage in openings in the mounting rail. The connecting hooks therefore achieve a linear guidance of the input modules perpendicular to the lower part of the surrounding side wall so that the quick connectors are guided straight into the openings of the surrounding side wall. The connecting hooks and the openings in the mounting rails are preferably embodied as tapering toward the bottom, thus achieving a precise positioning and centering of the input modules.

In a preferred embodiment, the connecting hooks provided on the back wall of the input modules engage in or under the openings in the mounting rail so that a clamping action for fixation of the input modules is produced between the connecting hooks and the openings.

Preferably, therefore, during the mounting of the input module in the generator junction box, the quick connector engages in or comes to rest against the opening in the surrounding side wall so that the input module is ready-mounted in the generator junction box the moment it is slid or snapped onto the mounting rail.

The string lines and the quick connectors of the input modules preferably have complementary connecting means, such as a screw connection, so that when the string line is fastened, this automatically fastens the input modules to the side wall of the junction box housing. It is thus optionally possible to eliminate a fastening of the input modules to the back wall of the generator junction box.

The quick connector on the input module can, for example, be a plug connector that can be connected in a plugging fashion to a complementary plug connector of the respective string line. For the connection of the string line to the input module, the plug connector of the input module according to the generator string line extends through the opening in the surrounding side wall of the junction box housing. In both cases, the connection, such as the plugged connection, of the string line to the input module can be established without performing additional steps such as opening the junction box door or installing string lines in the generator junction box. This means a significant reduction in the installation time required to establish the connection.

One example of a plug connector for use as a quick connector is the product SunClix® produced by the applicant. The SunClix® plug connector has an electrical contact, which is waterproofed by means of a dielectric housing, and a clamping spring, which can be snapped into a holding frame. Further details, such as with regard to the plug geometry, can be found in DE 10 2008 061 268 A1, which is incorporated herein by reference.

In one embodiment of the present disclosure, the input modules are fastened directly to the surrounding side wall, so that a fastening to the back wall or to a mounting means is not necessary.

For example, in order to fasten the input modules in the region of the openings, the surrounding side wall is equipped with external fastening elements by means of which the quick connectors of the input modules are fastened in the openings in the surrounding side wall. Such fastening elements are, for example, embodied in the form of detent elements or clamping elements which may engage in corresponding counterpart elements on the quick connector or in the form of a threaded sleeve. It is thus possible for the external fastening element on the surrounding side wall to be embodied in the form of an external thread on a protuberance surrounding the opening in a ring shape, onto which a coupling nut is screwed. In this embodiment, the fastening elements provided on the outside of the openings of the surrounding side walls perform the function of the strain relief of the string lines to the input modules. A fastening element of this kind can also have a sealing ring to produce a watertight seal of the passage through the surrounding side wall of the generator junction box. Consequently, the opening is already automatically sealed when the connection with the fastening element is produced.

In another example for a fastening of the input modules directly to the surrounding side wall, the quick connectors of the input modules are provided with detent recesses, detent hooks, or a threaded sleeve. In this case, the quick connector of the input module is guided into the opening of the surrounding side wall so that the input module comes to rest against the side wall and the coupling nut is screwed from the outside onto the outward-protruding external thread of the quick connector in order to screw-mount the input module to the side wall.

The input module for installation in generator junction boxes for photovoltaic systems therefore includes an integrated quick connector for direct connection of the electric string line of the photovoltaic system to the input module; when the input module is mounted in the generator junction box, the quick connector comes to rest in or directly against the associated opening in the surrounding side wall of the junction box housing. In other words, when it is mounted, the input module comes to rest against the side wall or engages in the opening of the side wall, thus making it possible to directly connect the string line from the outside to the input module accommodated inside the junction box housing.

The input module is embodied to fulfill a multiple function, performing at least one additional function in addition to connecting the string line. To this end, according to a preferred embodiment, the input module is equipped with a socket for a functional element. For example, the functional element is a fuse, a current measuring component, a voltage detector, or a microcontroller, which are inserted into the functional element socket. The voltage detector is either an overvoltage detector, e.g., a lightning protection device, or an undervoltage detector for avoiding hot spots; voltage deviations that exceed thresholds are detected and when such voltage deviations occur, the electrical connection is interrupted.

According to a preferred embodiment, the functional element socket is embodied so that the functional element on the input module is interchangeable. The functional element socket for an interchangeable functional element increases the flexibility of the input modules accommodated in the generator junction box since each input module can be equipped with the required functional element and inserted into the generator junction box.

The functional element socket can even be embodied so that different functional elements can be interchangeably inserted into the same functional element socket. This simplifies production sequences and increases the number of units for identical input modules to be produced, which in turn can reduce the price per unit.

In a particularly preferred embodiment, the input module has several functional element sockets in order to be able to insert several, e.g. different, functional elements into one input module. This makes it possible to minimize the number of modules in the generator junction box and the number of electrical connections. It is also possible to further reduce the size of the generator junction box.

Preferably, the input module is provided with a laterally situated, matchable connecting device for reciprocally connecting two or more input modules in order to insert a plurality of input modules as a unit into the generator junction box and fasten them there. The connected input modules are for example snapped as a unit onto the top hat rail; the quick connectors integrated into the primary side of the input modules automatically come to rest against or in the associated opening of the junction box housing. Furthermore, a bus connection can optionally be integrated into the laterally situated, matchable connecting device.

If the input modules are fastened directly to the surrounding side wall of the junction box housing, then it is possible to forego a fastening to the back wall of the housing.

The present disclosure will be explained in greater detail below in conjunction with exemplary embodiments with reference to the drawings; some elements that are the same or similar have been provided with the same reference numerals and the features of the various exemplary embodiments can be combined with one another.

BRIEF DESCRIPTION OF THE DRAWINGS

FIG. 1 shows a known generator junction box with conventional modules and a main circuit breaker, FIG. 2 shows an embodiment of a generator junction box according to the present disclosure, with five input modules and a main circuit breaker, FIG. 3 shows an embodiment of the generator junction box with eight input modules, FIG. 4 shows an embodiment of the generator junction box with four input modules and a mounting rail, FIG. 5 shows the same embodiment as FIG. 4, with two mounted input modules, FIG. 6 shows the same embodiment as FIG. 4, with three mounted input modules, FIG. 7 shows the same embodiment as FIG. 4, with four mounted input modules, FIG. 8 shows another embodiment of the generator junction box with eight mounted input modules as well as alternative string line connections, FIG. 9 shows a generator junction box with other embodiments of input modules.

DETAILED DESCRIPTION

FIG. 1 shows a known generator junction box 2 with a junction box housing 4, which has a surrounding side wall 6 and a back wall 5. The surrounding side wall 6 has openings 8 to permit string lines 24 to be fed through. Inside the generator junction box 2, there are various modules: the input modules 10a, the measuring module 32, the connecting module 34, and other modules 36 such as an overvoltage protection module and a main circuit breaker 38.

The input modules 10a for the plus pole shown on the left in FIG. 1 are connected to five string lines 24.

The string lines shown in FIG. 1 are individually routed through openings 8 of the surrounding side wall and on the inside of the generator junction box 2, are connected to input modules 10a by means of a screw connection. The input modules 10a correspond to simple connection terminals in the example shown.

The lines of the one electrical pole of the photovoltaic system strings, usually of the plus pole, are connected by means of electrical measuring module lines 31 downstream of the input modules 10a to a measuring module 32 that matches to the installed number of strings in order to measure the string line currents.

By means of the jumper module lines 33, the measuring module 32 is in turn connected to jumper modules 34 in order to bridge and thus combine the individual string currents. The combined current is then conveyed via a circuit breaker line 37 to a main circuit breaker 38 and is usually then conveyed via a grid line 25 to a grid inverter (not shown).

In the case shown, the flow of current of the other electrical pole of the photovoltaic system, usually the minus pole, is conveyed on the output side of the input modules 10a via an electrical line 35 to another module 36 and then via a circuit breaker line 37 to the main circuit breaker 38.

FIG. 2 shows a first embodiment using input modules 10 according to the present disclosure in a generator junction box 2; the design in FIG. 2 demonstrates significant differences from the generator junction box in FIG. 1. The input modules 10 with their quick connectors 12 (in the embodiment shown, they are each hidden by the respective complementary quick connector 22 of the string line 20) are situated directly against the surrounding side wall 6 of the junction box housing 4 so that the string lines 20 are directly connected to the quick connectors 12 of the input modules 10 from the outside of the side wall 6, without this requiring the installation of the string lines 20 or other electrical lines inside the generator junction box 2.

The input modules 10 in the embodiment shown have a plurality of functional element sockets 11, each for accommodating a respective fuse element 19c and a current measuring component 19a. Respective pairs of jumper contacts 19f are each situated, in electrical terms, downstream of the current measuring component 19a on the input modules 10 so as to bridge the input modules in pairs by means of jumpers 16 in order to combine the individual string currents and to convey them in bundled form to the main circuit breaker 38 via an electrical bus 30. In other words, the photovoltaic strings can already be connected in parallel fashion in the input modules 10. Consequently, not only can the string lines 20 be connected quickly and easily to the input modules 10 by means of the quick connectors 12, but also several functions are combined into a single module, which simplifies the internal structure of a generator junction box 2. The input module 10 thus constitutes a combination module for connecting the string line, for measuring a measurement variable such as current, and for bridging the parallel string lines.

FIG. 3 shows a simplified embodiment of the generator junction box 2 with a junction box housing 4 that has a surrounding side wall 6, a back wall 5, and a front (not shown). The surrounding side wall 6 is provided with openings 8 to permit quick connectors 12 of the input modules 10 and/or quick connectors 22 of the string lines 20 to pass through.

On the inside of the generator junction box 2, the input modules 10 are situated directly against the surrounding side wall 6 of the junction box housing 4, with the quick connectors 12 of the input modules 10 coming to rest in the openings in the surrounding side wall 6 of the junction box housing 4.

The quick connectors 22 that are situated at the end of the string line 20 can be connected in complementary fashion to the quick connectors 12 of the input modules. By means of the quick connectors 22, the string lines 20 can be quickly and conveniently connected to the input modules 10 in the generator junction box 2.

The input modules 10 are electrically connected to each other by means of jumpers 16 in that the jumpers 16 are connected to a respective jumper contact 19f of each input module 10. An electrical bus 30 carries off the combined current from the input modules.

FIGS. 4 through 7 show a simple embodiment of a generator junction box with a mounting means in the form of a mounting rail 18. As shown in FIG. 4, the side of the input modules 10 oriented toward the back wall is provided with a tapering connecting hook 14. This connecting hook 14 of the input module 10 can be inserted into openings 15 in the mounting rail 18 by means of a linear movement from top to bottom in the direction of the drawing. Consequently, the connecting hooks ensure a linear guidance and centering of the modules in order to reliably guide the quick connectors 12 into the openings 8 of the junction box housing 4 with a single motion hand. As a result, the input module 10 shown on the left in FIG. 4 is already situated in the end position at the mounting rail 18, with the connecting hook 14 inserted into the opening 15 in the mounting rail. If the connecting hook 14 is embodied so that it partially engages under the opening 15 in the mounting rail 18 (not shown), then a clamping force between the connecting hook 14 of the input module 10 and the opening 15 in the mounting rail 18 can fix the input module 10 in the opening 15.

In the example shown, the quick connectors 12 of the input modules and the quick connectors 22 of the string line 20 are drawn as SunClix® connectors produced by the applicant. The SunClix® connectors have detent hooks 27, which in the mounted state, engage in detent recesses 27a provided on the input module 10 and thus produce a secure connection by means of detent engagement.

The string line 20 is strain-relieved with the detent hooks 27 in the detent recesses 27a of the input module 10. Three other input modules 10 are shown in a not-yet mounted state in the generator junction box 2.

FIG. 5 shows the same embodiment as FIG. 4; the input modules and string lines are likewise equipped with the SunClix® connectors and a second input module 10, by means of its connecting hook 14 oriented toward the back wall, a second input module 10 is already fastened to the mounting rail and as a result of this, has likewise come to rest with the quick connector 12 directly in the opening 8 of the surrounding side wall 6 of the generator junction box housing 4. In other words, the quick connector 12 of the input module 10 extends through the opening in the surrounding side wall 6 of the junction box housing 4. The second input module 10 is also connected to a string line 20, the two input modules 10 are electrically connected to each other by means of a jumper 16 connected to a jumper contact 19f. The use of a jumper 16 between the input modules 10 permits the use of only one electrical bus 34 to carry off the electrical current generated by the photovoltaic solar modules from the input modules 10. In addition, the connection of the two quick connectors 12, 22 fastens the second input module 10 to the surrounding side wall 6 of the junction box housing 4, thus providing a stable mount without having to rely on an additional screw connection or other connection. The quick connectors 22, 12 also permit a strain relief of the string lines 20. The two input modules 10 shown on the right in FIG. 5 are not yet in a mounted state.

FIG. 6 shows the same embodiment as FIG. 4; three input modules 10 have already been slid onto a mounting rail and have come to rest directly in the openings of the surrounding side wall 6 of the junction box housing 4. The third input module 10 is also electrically connected by means of a jumper contact 19f via a jumper 16 to the two already mounted input modules 10. The input module 10 on the right is not yet in the mounted state.

FIG. 7 shows the same embodiment as FIG. 4; all four of the input modules 10 shown have been slid onto the mounting rail 18. The sliding of the input modules 10 onto the mounting rail 18 can already provide a satisfactory fixing of the input modules 10 by means of the clamping force of the connecting hooks 14 in the openings 15 in the mounting rail 18.

In one embodiment of the quick connectors 12, 22 of the input modules 10, the input modules 10 are fastened in that the quick connectors 12, 22 are fastened directly to the surrounding side wall 6 of the junction box housing 4 encompassing the opening 8, e.g. by means of screwing, clamping, or detent engagement.

In this embodiment, a sealing ring (not shown) is mounted on the quick connector 22 of the string line 20 so that when the connection is established, a watertight seal of the opening 8 and therefore of the generator junction box 2 is achieved. In other words, the connection of the string line 20 to the input module 10 via the quick connectors 12, 22 produces a watertight seal of the respective opening 8 of the junction box housing 4.

FIG. 8 shows an embodiment with eight input modules 10 that have been slid onto a mounting rail, all electrically contacted to one another by means of a shared jumper 16. In this embodiment, a stripped conductor end 26 is plugged directly into the quick connector bushing 12 of the input module 10, a coupling nut 28 is screwed tightly onto an external thread of the bushing 12, which simultaneously fastens the input module to the side wall and likewise ensures a secure and strain-relieving connection of the string line 24 to the input module 10 by means of a crimped ferrule. Also in this embodiment, the presence of the jumper 16 means that only one electrical bus 30 is required to carry off the electrical current. For example, the electrical bus 30 leads to a main circuit breaker 38 (see FIG. 2), which is typically also located in or on the generator junction box.

Finally, FIG. 9 shows an embodiment of the generator junction box 2; the input modules 10 are situated directly against the surrounding side wall 6 of the junction box housing 4 and are fastened to it directly. A mounting rail is not provided in this embodiment. The input modules 10 are electrically connected to one another by means of a jumper 16. The input modules 10 have sockets 11 for functional elements 19. Various options for the arrangement of the functional elements 19 are shown, which represent different respective embodiments of the input modules 10. Typically, at least the input modules 10 of one electrical pole of the photovoltaic generator are embodied with the same design so that all of the strings are associated with the same functions. It is, however, also possible to provide a combination of different embodiments of the input modules 10 in one generator junction box 2.

In the case of the input module 10 shown on the left, a functional element 19 in the form of a fuse 19c is inserted. A microcontroller 19b is inserted into the second input module 10. In an arrangement of the third input module 10, a fuse 19c, a current measuring component 19a, and a voltage detector 19g are integrated into one input module 10. According to the sixth input module 10, a fuse 19c, a voltage detector 19g, a current measuring component 19a, and a microcontroller 19b are integrated into the input module 10.

The attachment of a plurality of functional elements 19a, 19b, 19c, 19g in the functional element sockets 11 of the input modules 10 is thus insured, making it possible to eliminate separate components and a plurality of different modules since the desired functions can already be fulfilled by the input modules 10.

The openings 8 in the surrounding side wall 6 of the junction box housing 4 are sealed in a watertight fashion by the quick connectors of the input modules at least after the connection with the quick connectors 22 of the string lines 20 has been produced.

A bus connection (not shown) for communication between the input modules in the embodiment shown, for example, for communication between the current measuring component 19a and the microcontroller 19b and/or for connecting to a central location such as a desktop PC can also be integrated into all input modules 10.

It is clear to the person skilled in the art that the embodiments described above are understood to be examples and that the invention is not limited to these, but can be varied in numerous ways without going beyond the scope of the invention. It is also clear that the features, regardless of whether they are disclosed in the description, the claims, the drawings, or in some other way, also individually define an essential components of the present disclosure, even when they are described together with other features.

LIST OF REFERENCE NUMERALS 2 generator junction box
4 junction box housing
6 surrounding side wall of the junction box housing
8 opening
10 input module
10a input module
11 functional element socket 12 quick connector
14 connecting hook oriented toward back wall
15 opening in the mounting rail
16 jumper
18 mounting rail or mounting plate
19 functional element
19a current measuring component
19b microcontroller
19c fuse element
19f jumper contact
19g voltage detector
20 string line
22 quick connector
23 seal
24 string line
25 grid line
26 insulated conductor end
27 detent hook of the SunClix® connector
27a detent recess of the SunClix® connector
28 coupling nut
30 electrical bus
31 measuring module line
32 measuring module
33 jumper module line
34 jumper module
35 electrical line
36 additional module
37 circuit breaker line
38 main circuit breaker

The invention claimed is:

1. A generator junction box for a photovoltaic generator, including a junction box housing with a back wall and a surrounding side wall, input modules, each with an integrated quick connector for connecting a generator string line to the associated input module, wherein the input modules are situated directly at the surrounding side wall of the junction box housing in such a way that it is possible to connect the string lines directly to the quick connector of the associated input module from an outside of the junction box housing, wherein the side wall of the junction box housing has openings, and when mounting the input modules with the integrated quick connectors in the junction box, the quick connectors integrated into the input modules can be advanced from an inside of the junction box housing at the respective opening and/or can be fed through the respective opening to the outside of the junction box housing, and therewith the integrated quick connectors come to rest in or directly at the respective opening.

2. The generator junction box according to claim 1, wherein by means of a respective jumper contact via a jumper, several input modules are connected together to form a bus module plus pole and/or several input modules are connected together to form a bus module minus pole.

3. The generator junction box according to claim 1, having a main circuit breaker situated on the junction box housing for disconnecting the photovoltaic generator from the power grid.

4. The generator junction box according to claim 1, wherein a mounting rail or mounting plate for fastening the input modules is contained in the junction box housing and when the input modules are mounted onto the mounting rail or mounting plate, the quick connectors integrated into the input modules come to rest in or directly at the openings.

5. The generator junction box according to claim 4, wherein the junction box includes the mounting rail and the mounting rail is a top hat rail onto which the input modules can be snapped and when they are snapped onto the top hat rail, the quick connectors integrated into the input modules come to rest in or directly at the openings of the generator junction box.

6. The generator junction box according to claim 4, wherein the junction box includes the mounting rail and the mounting rail has openings for receiving connecting hooks situated on the back side of the input modules in order to align and/or fasten the input modules with/to the mounting rail by means of the connecting hooks.

7. The generator junction box according to claim 1, wherein the quick connector on the input module is embodied as a plug connector and is connectable in plug fashion to a complementary plug connector of the respective generator string line and the plug connector of the input module extends through one of the openings in the surrounding side wall of the junction box housing or in the plugged-together state, the plug connector of the generator string line extends through the opening in the surrounding side wall of the junction box housing.

8. The generator junction box according to claim 1, wherein the quick connector on the input module has a threaded sleeve and by means of a coupling nut on the string line, it is possible to fasten the string line to the input module of the generator junction box when a stripped cable end is connected to the input module.

9. The generator junction box according to claim 8, wherein the input modules include seals for producing a watertight seal of the openings.

10. An input module for quick installation in a generator junction box for a photovoltaic generator, the junction box having a junction box housing with a back wall and a surrounding side wall, and the input module including: an integrated quick connector for connecting an electrical string line of a photovoltaic system directly to the input module, wherein when the input module is mounted in the generator junction box, the quick connector comes to rest in or directly at an opening in the surrounding side wall of the junction box housing.

11. The input module according to claim 10, also including: at least one functional element socket for accommodating a functional element in the input module, wherein the functional element is embodied as interchangeable on the input module.

12. The input module according to claim 11, wherein the functional element is a fuse, a current measuring component, a microcontroller, and/or a voltage detector.

13. The input module according to claim 12, wherein several functional element sockets are integrated into an input module.

14. The input module according to claim 10, also including: matchable fastening elements for reciprocally connecting two or more input modules in order to snap a plurality of input modules as a unit onto a top hat rail, wherein the integrated quick connectors of the input modules automatically come to rest at or in the associated opening of the junction box housing.

* * * * *